(12) United States Patent
Ichijyo et al.

(10) Patent No.: US 8,879,256 B2
(45) Date of Patent: Nov. 4, 2014

(54) ELECTRIC POWER CONVERSION APPARATUS

(75) Inventors: Hiromi Ichijyo, Chiryu (JP); Takahisa Kaneko, Okazaki (JP); Takeshi Fujihara, Toyota (JP); Kenshiro Hida, Chiryu (JP)

(73) Assignee: Denso Corporation, Kariya (JP)

( * ) Notice: Subject to any disclaimer, the term of this patent is extended or adjusted under 35 U.S.C. 154(b) by 277 days.

(21) Appl. No.: 13/430,789

(22) Filed: Mar. 27, 2012

(65) Prior Publication Data
US 2012/0250380 A1 Oct. 4, 2012

(30) Foreign Application Priority Data

Mar. 30, 2011 (JP) ................................. 2011-074698
Oct. 21, 2011 (JP) ................................. 2011-232216

(51) Int. Cl.
*H05K 7/20* (2006.01)
*F28F 7/00* (2006.01)
*H01L 23/48* (2006.01)
*H02M 7/00* (2006.01)

(52) U.S. Cl.
CPC ........... *H05K 7/20927* (2013.01); *H02M 7/003* (2013.01)
USPC ..... 361/699; 361/716; 165/80.4; 165/104.33; 165/185; 257/714; 257/686; 257/734; 257/773; 257/726

(58) Field of Classification Search
USPC ....................... 361/679.46–679.54, 688–723; 165/80.4–80.5, 104.33; 257/714, 719; 174/15.1, 547; 363/141
See application file for complete search history.

(56) References Cited

U.S. PATENT DOCUMENTS

| | | | |
|---|---|---|---|
| 8,125,781 B2* | 2/2012 | Mamitsu et al. | 361/702 |
| 2006/0096299 A1* | 5/2006 | Mamitsu et al. | 62/3.2 |
| 2006/0226450 A1* | 10/2006 | Furuta et al. | 257/208 |
| 2006/0284308 A1 | 12/2006 | Harada et al. | |
| 2010/0304264 A1* | 12/2010 | Wakahoi et al. | 429/452 |
| 2011/0194248 A1* | 8/2011 | Nakasaka et al. | 361/689 |
| 2013/0070502 A1* | 3/2013 | Suzuki et al. | 363/131 |

FOREIGN PATENT DOCUMENTS

| | | |
|---|---|---|
| JP | 2005-073374 | 3/2005 |
| JP | 2007-166819 | 6/2007 |
| JP | 2007-166820 | 6/2007 |

(Continued)

OTHER PUBLICATIONS

Office Action (3 pages) dated Aug. 20, 2013, issued in corresponding Japanese Application No. 2011-232216 and English translation (3 pages).

(Continued)

*Primary Examiner* — Zachary M Pape
(74) *Attorney, Agent, or Firm* — Nixon & Vanderhye P.C.

(57) ABSTRACT

An electric power conversion apparatus includes a plurality of semiconductor modules, a frame, a control circuit board, and a reinforcing and fixing member. Each of the semiconductor modules has a plurality of control terminals. The frame receives the semiconductor modules therein. The frame has, at least, a pair of side walls that face each other with the semiconductor modules interposed therebetween. The control circuit board is located outside of the frame and has the control terminals of the semiconductor modules connected thereto. The reinforcing and fixing member extends to connect the side walls of the frame, thereby reinforcing the frame. The reinforcing and fixing member also has the control circuit board fixed thereto so that the reinforcing and fixing member is positioned between the control circuit board and the semiconductor modules.

10 Claims, 11 Drawing Sheets

(56) References Cited

FOREIGN PATENT DOCUMENTS

| | | |
|---|---|---|
| JP | 2009-094257 | 4/2009 |
| JP | 2009-266986 | 11/2009 |
| JP | 2010-087002 | 4/2010 |
| JP | 2010-273422 | 12/2010 |

OTHER PUBLICATIONS

Office Action (3 pgs.) dated Feb. 18, 2014 issued in corresponding Japanese Application No. 2011-232216 with an at least partial English-language translation thereof (4 pgs.).

\* cited by examiner

ELECTRIC POWER CONVERSION APPARATUS

CROSS-REFERENCE TO RELATED APPLICATIONS

This application is based on and claims priority from Japanese Patent Applications No. 2011-74698 filed on Mar. 30, 2011 and No. 2011-232216 filed on Oct. 21, 2011, the contents of which are hereby incorporated by reference in their entireties into this application.

BACKGROUND

1. Technical Field

The present invention relates to electric power conversion apparatuses that include means for cooling semiconductor modules that form electric power conversion circuits.

2. Description of the Related Art

Electric power conversion circuits, such as a DC-DC converter circuit and a DC-AC inverter circuit, are used in generating, for example, drive power for driving AC motors that make up power sources of motor vehicles, such as an electric vehicle and a hybrid vehicle.

Moreover, for enabling an AC motor to generate high torque, it is generally necessary to drive the AC motor with large drive power. Accordingly, in an electric power conversion circuit for generating the drive power for driving the AC motor, semiconductor modules generally generate a large amount of heat; the semiconductor modules include therein power semiconductor elements, such as an IGBT (Insulated Gate Bipolar Transistor), for forming the electric power conversion circuit. Therefore, it is also necessary to cool the semiconductor modules.

To solve the above problem, Japanese Patent Application Publications No. 2007-166819 and No. 2007-166820 disclose a technique according to which cooling pipes are alternately stacked with the semiconductor modules. Consequently, a coolant can flow through the cooling pipes, thereby cooling the semiconductor modules.

More specifically, as shown in FIG. 11, the semiconductor modules 921 are alternately stacked with the cooling pipes 922 in a stacking direction (i.e., the direction perpendicular to the paper surface of FIG. 11) to form a stacked body 92. Further, the stacked body 92 is received in a frame 93. The frame 93 has an opening 931 that opens in a direction perpendicular to the stacking direction (i.e., the upward direction in FIG. 11).

Furthermore, in the frame 93, a pressing member (not shown), which presses the stacked body 92 in the stacking direction, is disposed at one end of the stacked body 92 in the stacking direction. Moreover, each of the semiconductor modules 921 includes a plurality of control terminals 923 that are connected to a control circuit board 94. The control circuit board 94 makes up part of the electric power conversion circuit.

The frame 93 also has a bottom wall 932 and a plurality of side walls 933. The bottom wall 932 is formed on the opposite side to the opening 931 of the frame 93 in the direction perpendicular to the stacking direction (i.e., the vertical direction in FIG. 11). The side walls 933 each extend perpendicular to the bottom wall 932 and together define the opening 931 of the frame 93. That is, the internal space of the frame 93 is completely opened, by the opening 931, on the opposite side to the bottom wall 932. Moreover, each of the side walls 933 has, at its end on the opening 931 side (i.e., at its upper end in FIG. 11), a fixing portion 935 for fixing the control circuit board 94.

With the above configuration, however, the rigidity of the frame 93 may be low on the opening 931 side because the frame 93 is completely opened by the opening 931. Consequently, with the low rigidity, the side walls 933 of the frame 93 may be easily caused, for example by external vibration transmitted to the electric power conversion apparatus 9, to vibrate on the opening 931 side (i.e., on the upper side in FIG. 11). Further, the vibration of the side walls 933 may induce stress in the control circuit board 94 that is fixed to the fixing portions 935 of the side walls 933. As a result, due to the stress induced in the control circuit board 94, connection failure may occur between the control circuit board 94 and the control terminals 923 of the semiconductor modules 921.

SUMMARY

According to an exemplary embodiment, an electric power conversion apparatus is provided which includes a plurality of semiconductor modules, a frame, a control circuit board, and a reinforcing and fixing member. Each of the semiconductor modules has a plurality of control terminals. The frame receives the semiconductor modules therein. The frame has, at least, a pair of side walls that face each other with the semiconductor modules interposed therebetween. The control circuit board is located outside of the frame and has the control terminals of the semiconductor modules connected thereto. The reinforcing and fixing member extends to connect the side walls of the frame, thereby reinforcing the frame. The reinforcing and fixing member also has the control circuit board fixed thereto so that the reinforcing and fixing member is positioned between the control circuit board and the semiconductor modules.

Consequently, with the reinforcing and fixing member, the rigidity of the frame is improved. Accordingly, when external vibration is transmitted to the electric power conversion apparatus, it is possible to suppress vibration of the side walls of the frame due to the external vibration. In other words, the vibration resistance of the frame is improved. Further, it is also possible to suppress vibration of the control circuit board due to the vibration of the side walls of the frame. As a result, it is possible to prevent stress from being induced in the control circuit board, thereby preventing connection failure from occurring between the control circuit board and the control terminals of the semiconductor modules.

Moreover, in the electric power conversion apparatus, the reinforcing and fixing member performs both the function of reinforcing the frame and the function of fixing the control circuit board. Consequently, it becomes possible to fix the control circuit board at a suitable position without employing any additional fixing member. As a result, it becomes possible to simplify the structure of the frame and reduce the parts count of the electric power conversion apparatus.

It is preferable that the frame has a plurality of facing pairs of side walls, and all the side walls of the frame together enclose the semiconductor modules.

The reinforcing and fixing member may be integrally formed with the side walls of the frame into one piece.

In a further implementation, the semiconductor modules are stacked with a plurality of coolant passages to form a stacked body, and the stacked body is received in the frame. Moreover, in this case, it is preferable that the semiconductor modules are alternately stacked with the coolant passages.

The frame may also have a bottom wall that extends, on the opposite side of the stacked body to the reinforcing and fixing member, to connect the side walls of the frame. Further, in this case, the stacked body may be sandwiched between the reinforcing and fixing member and the bottom wall of the frame.

The side walls of the frame may be respectively positioned on opposite sides of the stacked body in the stacking direction of the stacked body. Further, in this case, a pressing member may be interposed between the stacked body and one of the side walls of the frame in the stacking direction to press and thereby hold the stacked body.

In another further implementation, in the reinforcing and fixing member, there are formed a plurality of through-holes through each of which a corresponding one of the control terminals of the semiconductor modules extends so as to be connected to the control circuit board. Further, each of the through-holes has a cross section that tapers toward the control circuit board, thereby allowing the corresponding control terminal to be positioned, by the through-hole, with respect to the control circuit board.

BRIEF DESCRIPTION OF THE DRAWINGS

The present invention will be understood more fully from the detailed description given hereinafter and from the accompanying drawings of exemplary embodiments, which, however, should not be taken to limit the invention to the specific embodiments but are for the purpose of explanation and understanding only.

In the accompanying drawings.

DESCRIPTION OF EMBODIMENTS

Figure 1:
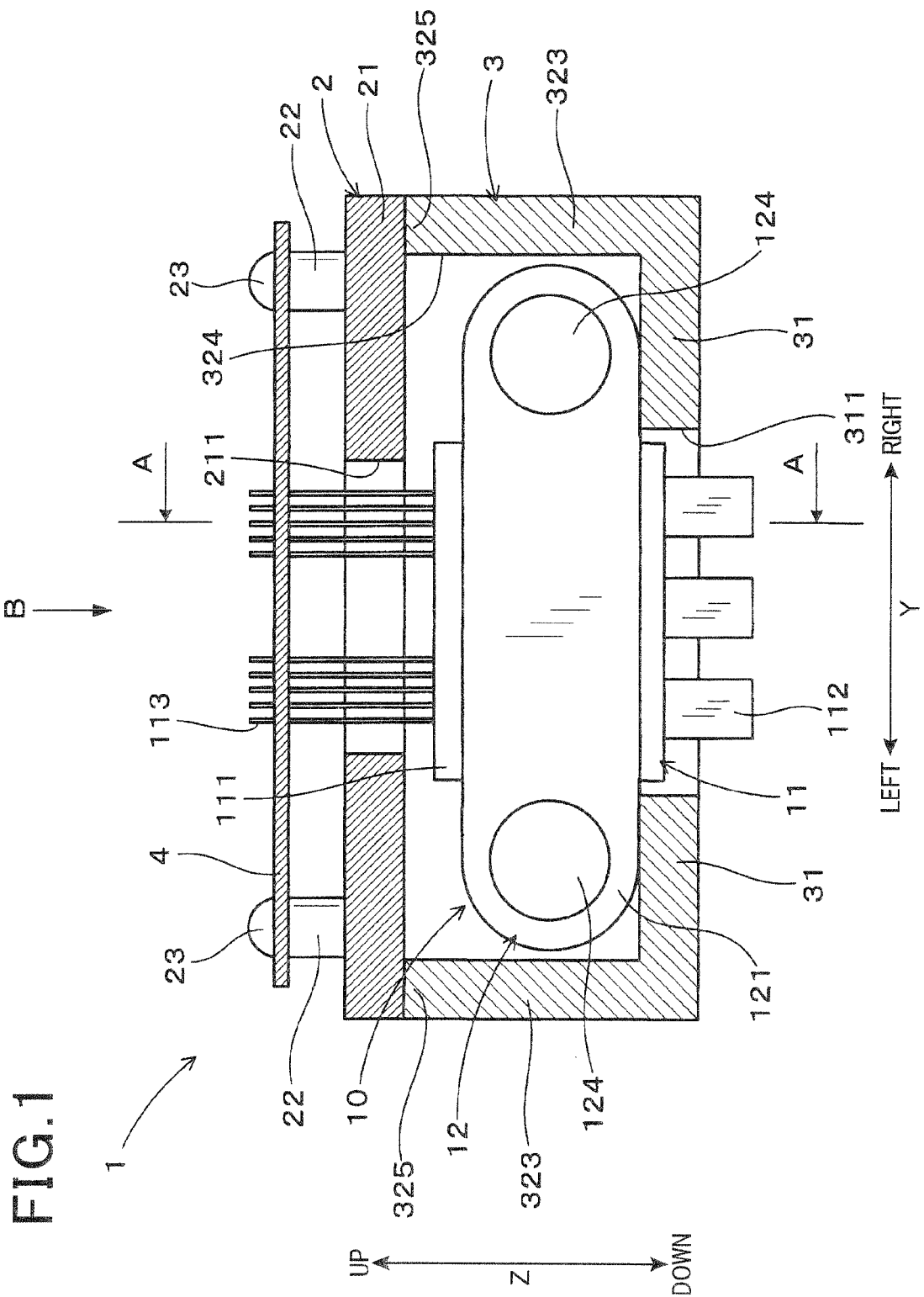
FIG. 1 is a cross-sectional view illustrating the overall configuration of an electric power conversion apparatus according to a first embodiment.

Exemplary embodiments will be described hereinafter with reference to FIGS. 1-10. It should be noted that for the sake of clarity and understanding, identical components having identical functions in different embodiments have been marked, where possible, with the same reference numerals in each of the figures and that for the sake of avoiding redundancy, descriptions of the identical components will not be repeated.

[First Embodiment]

Figure 2:
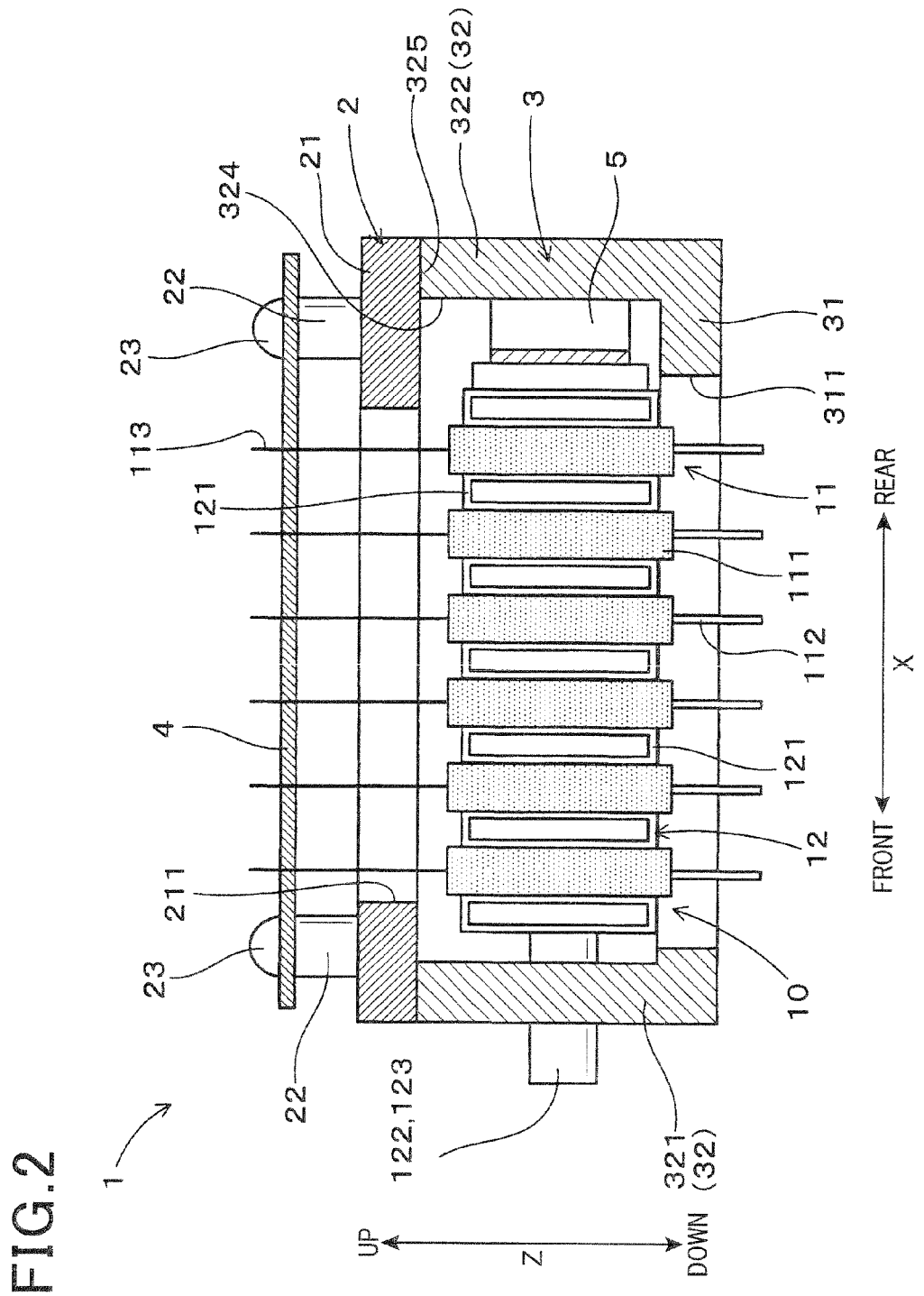
FIG. 2 is a cross-sectional view of the electric power conversion apparatus according to the first embodiment taken along the line A-A in FIG. 1.
Figure 3:
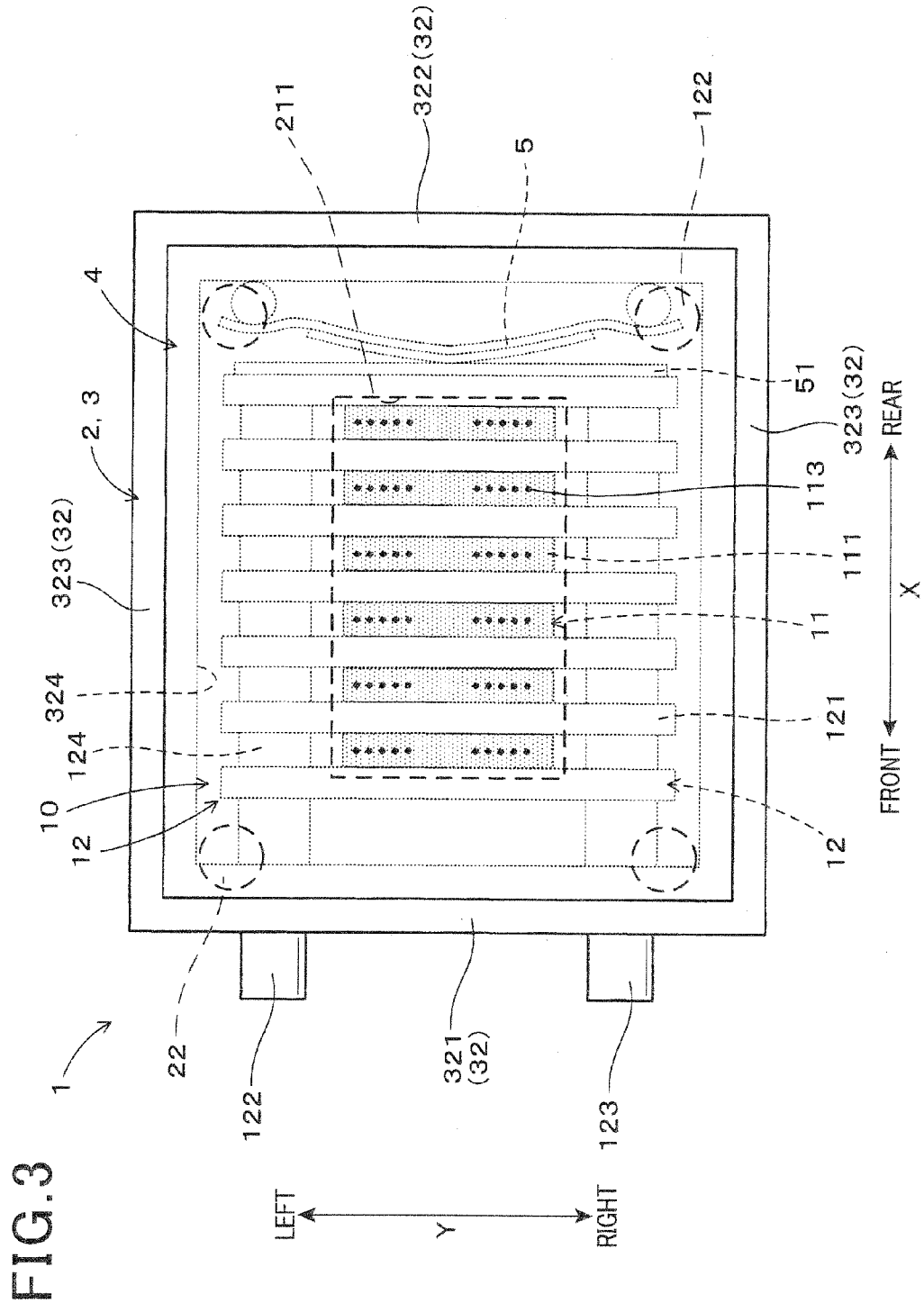
FIG. 3 is a top view of the electric power conversion apparatus according to the first embodiment along the B direction in FIG. 1.

Referring to FIGS. 1-3, an electric power conversion apparatus 1 according to a first embodiment includes a plurality of semiconductor modules 11, a control circuit board 4, a frame 3, and a reinforcing and fixing member 2. The semiconductor modules 11 form part of an electric power conversion circuit and each have a plurality of control terminals 113. The frame 3 receives the semiconductor modules 11 therein. The frame 3 has, at least, a pair of side walls 32 that face each other with the semiconductor modules 11 interposed therebetween. The control circuit board 4 is located outside of the frame 3 and has the control terminals 113 of the semiconductor modules 11 connected thereto. The reinforcing and fixing member 2 extends to connect the side walls 32 of the frame 3, thereby reinforcing the frame 3. Further, the reinforcing and fixing member 2 has the control circuit board 4 fixed thereto so that the reinforcing and fixing member 2 is positioned between the control circuit board 4 and the semiconductor modules 11.

For the sake of convenience of explanation, hereinafter, the direction in which the semiconductor modules 11 are alternately stacked with a plurality of cooling pipes 121 will be referred to as the X direction (see FIGS. 2 and 3); the direction which is perpendicular to the X direction and coincides with the longitudinal directions of the cooling pipes 121 will be referred to as the Y direction (see FIGS. 1 and 3); and the direction which is perpendicular to both the X and Y directions will be referred to as the Z direction (see FIGS. 1 and 2). Moreover, in the X direction, the side on which both an inlet pipe 122 and an outlet pipe 123 protrude from the frame 3 will be referred to as front side and the side opposite to the front side will be referred to as rear side (see FIGS. 2 and 3); opposite sides in the Y direction will be respectively referred to as left side and right side (see FIGS. 1 and 3); in the Z direction, the side on which the reinforcing and fixing member 2 is disposed will be referred to as upside and the side opposite to the upside will be referred to as downside (see FIGS. 1 and 2).

Specifically, in the present embodiment, as shown in FIGS. 1-3, the semiconductor modules 11 are alternately stacked with the cooling pipes 121 in the X direction to form a stacked body 10. Consequently, in the stacked body 10, for each of the semiconductor modules 11, both the major surfaces of the semiconductor module 11 can be cooled by a coolant flowing through those of the cooling pipes 121 which respectively abut the major surfaces. Further, the stacked body 10 is received in the frame 3.

Each of the semiconductor modules 11 has a switching element, such as an IGBT (Insulated Gate Bipolar Transistor) and a MOSFET (Metal Oxide Semiconductor Field-Effect Transistor), built therein. More specifically, each of the semiconductor modules 11 includes a main body 111, a plurality of electrode terminals 112, and the control terminals 113. The main body 111 is formed, by resin-molding the switching element, into a flat plate shape. The main body 111 has a pair of major surfaces which respectively make up the major surfaces of the semiconductor module 11. In the stacked body 10, both the major surfaces of the main body 111 extend perpendicular to the X direction (i.e., the stacking direction of the semiconductor modules 11 and the cooling pipes 121). The electrode terminals 112 are formed so as to protrude downward in the Z direction from a lower end surface of the main body 111. Further, the electrode terminals 112 are connected to corresponding bus bars that are not shown in the figures. On the other hand, the control terminals 113 are formed so as to protrude upward in the Z direction from an upper end surface of the main body 111. Further, the control terminals 113 are connected to the control circuit board 4 that is located upside of the semiconductor modules 11.

In operation, control current for controlling the switching elements of the semiconductor modules 11 is input from the control circuit board 4 to the semiconductor modules 11 via the respective control terminals 113. On the other hand, via the respective electrode terminals 112, DC power is input from a DC power source (not shown) to the semiconductor modules 11 while AC power is output from the semiconductor modules 11 to an AC load (not shown).

The cooling pipes 121 are made of a metal, such as aluminum. Each of the cooling pipes 121 has a coolant passage formed therein, so that a coolant can flow through the coolant passages formed in the cooling pipes 121 to cool the semiconductor modules 11. More specifically, in the stacked body 10, each adjacent pair of the cooling pipes 121 have a corresponding one of the semiconductor modules 11 held therebetween, thereby cooling the major surfaces of the corresponding semiconductor module 11.

Moreover, for each adjacent pair of the cooling pipes 121, there are provided two connecting pipes 124 that extend in the X direction so as to respectively connect two pairs of corresponding Y-directional end portions of the cooling pipes 121.

Further, there are also provided an inlet pipe 122 and an outlet pipe 123 that are respectively connected to the Y-directional end portions of that one of the cooling pipes 121 which is located at the front end of the stacked body 10 in the X direction. In addition, as shown in FIGS. 2 and 3, both the inlet pipe 122 and the outlet pipe 123 extend forward from the front surface of the cooling pipe 121 located at the front end of the stacked body 10 so as to protrude outside of the frame 3.

Consequently, all of the cooling pipes 121, the inlet pipe 122, the outlet pipe 123 and the connecting pipes 124 together make up a cooler (or cooling device) 12 for cooling the semiconductor modules 11.

In operation, the coolant is first introduced into the cooling pipe 121 located at the front end of the stacked body 10 via the inlet pipe 122, and then distributed by the left-side connecting pipes 124 to flow through all the cooling pipes 121 in the Y direction (i.e., in the longitudinal directions of the cooling pipes 121). Consequently, during the flow of the coolant through the cooling pipes 121, heat is exchanged between the coolant and the semiconductor modules 11, thereby cooling the semiconductor modules 11 and increasing the temperature of the coolant. Thereafter, the coolant is gathered by the right-side connecting pipes 124, and finally discharged out of the cooling pipe 121 located at the front end of the stacked body 10 via the outlet pipe 123.

In addition, as the coolant flowing through the cooling pipes 121, any of the following coolants can be used: a natural coolant, such as water and ammonia; water mixed with an ethylene glycol-based antifreeze liquid; a fluorocarbon coolant such as fluorinert; a flon coolant such as HCFC123 and HFC134a; an alcohol coolant such as methanol; and a ketone coolant such as acetone.

In the frame 3, there is also received a pressing member 5 that presses the stacked body 10. More specifically, in the present embodiment, the pressing member 5 is implemented by, for example, a leaf spring. As shown in FIGS. 2 and 3, the pressing member 5 is disposed on the rear side of the stacked body 10 in the X direction so as to press the stacked body 10 forward. Consequently, with the pressing force of the pressing member 5, the stacked body 10 is held in the frame 3. In addition, between the pressing member 5 and the stacked body 10, there is interposed a contact plate 51 that makes surface contact with a rear end surface of the stacked body 10.

The frame 3 has a substantially rectangular bottom wall 31, on which the stacked body 10 is disposed, and four side walls 32 that each extend upward from an outer periphery of the bottom wall 31 and together define an opening 324 of the frame 3 at the upper end of the frame 3.

The bottom wall 31 has a through-hole 311 formed therein. As shown in FIGS. 1 and 2, lower end portions of the semiconductor modules 11, which protrude downward from the lower end surfaces of the cooling pipes 121, are inserted in the through-hole 311 of the bottom wall 31, thereby allowing the lower end surfaces of the cooling pipes 121 to abut the upper surface of the bottom wall 31 on both sides of the semiconductor modules 11 in the Y direction. Moreover, the electrode terminals 112 of the semiconductor modules 11 extend downward through the through-hole 311 of the bottom wall 31 so as to protrude outside of the frame 3.

In the present embodiment, the side walls 32 of the frame 3 include a pair of front and rear walls 321 and 322 that face each other in the X direction and have the stacked body 10 interposed therebetween, and a pair of left and right walls 323 that face each other in the Y direction and have the stacked body 10 interposed therebetween. All the side walls 32 of the frame 3 together enclose the stacked body 10 with the electrode terminals 112 of the semiconductor modules 11 protruding therefrom downward and the control terminals 113 of the semiconductor modules 11 protruding therefrom upward. In addition, the frame 3 is made of a metal, such as aluminum and stainless steel, or an alloy.

In the present embodiment, the reinforcing and fixing member 2 is implemented by a substantially rectangular metal plate that is formed separately from the frame 3 and fixed to the upper ends of the side walls 32 of the frame 3 so as to cover the opening 324 of the frame 3.

More specifically, in the present embodiment, the reinforcing and fixing member 2 includes a main body 21 and four mounts (or fixing portions) 22. The main body 21 has the shape of a substantially rectangular plate and is fixed to upper end portions 325 of the side walls 32 of the frame 3 by means of a plurality of bolts (not shown). The mounts 22 are respectively formed on four corner portions of the upper end surface of the main body 21. Each of the mounts 22 has a substantially cylindrical shape and a tapped bore formed in the upper end surface thereof. The control circuit board 4 is fixed to the upper end surfaces of the mounts 22 by fastening four screws 23 respectively into the tapped bores of the mounts 22. In addition, the main body 21 has a through-hole 211 formed therein, thereby allowing the control terminals 113 of the semiconductor modules 11 to extend upward to the control circuit board 4 through the through-hole 211 of the main body 21.

The reinforcing and fixing member 2 may be made of a metal, such as aluminum and stainless steel, or an alloy. In the present embodiment, to prevent the electric power conversion circuit from being short-circuited due to contact between the reinforcing and fixing member 2 and the control terminals 113 of the semiconductor modules 11, the reinforcing and fixing member 2 is made of an aluminum alloy having an insulation layer formed on its surface.

In addition, the reinforcing and fixing member 2 may be electrically insulated from the control terminals 113 of the semiconductor modules 11 by other alternative methods, for example by making the entire reinforcing and fixing member 2 with an insulative resin or providing the through-hole 211 of the main body 21 of the reinforcing and fixing member 2 with an insulative resin-made collar.

Next, the advantages of the electric power conversion apparatus 1 according to the present embodiment will be described.

In the present embodiment, the electric power conversion apparatus 1 includes the semiconductor modules 11, the frame 3, the control circuit board 4, and the reinforcing and fixing member 2. Each of the semiconductor modules 11 has the control terminals 113. The frame 3 receives the semiconductor modules therein. The frame 3 has the two facing pairs of the side walls 32, i.e., the pair of front and rear walls 321 and 322 that face each other in the X direction with the semiconductor modules 11 interposed therebetween and the pair of left and right walls 323 that face each other in the Y direction with the semiconductor modules 11 interposed therebetween. The control circuit board 4 is located outside of the frame 3 and has the control terminals 113 of the semiconductor modules 11 connected thereto. The reinforcing and fixing member 2 extends to connect the side walls 32 of the frame 3, thereby reinforcing the frame 3. The reinforcing and fixing member 2 also has the control circuit board 4 fixed thereto so that the reinforcing and fixing member 2 is positioned between the control circuit board 4 and the semiconductor modules 11.

Consequently, with the reinforcing and fixing member 2, the rigidity of the frame 3 is improved. Accordingly, when external vibration is transmitted to the electric power conversion apparatus 1, it is possible to suppress vibration of the side walls 32 of the frame 3 due to the external vibration. In other words, the vibration resistance of the frame 3 is improved. Further, it is also possible to suppress vibration of the control circuit board 4 due to the vibration of the side walls 32 of the frame 3. As a result, it is possible to prevent stress from being induced in the control circuit board 4, thereby preventing connection failure from occurring between the control circuit board 4 and the control terminals 113 of the semiconductor modules 11.

Moreover, in the electric power conversion apparatus 1, the reinforcing and fixing member 2 performs both the function of reinforcing the frame 3 and the function of fixing the control circuit board 4. Consequently, it becomes possible to fix the control circuit board 4 at a suitable position without employing any additional fixing member. As a result, it becomes possible to simplify the structure of the frame 3 and reduce the parts count of the electric power conversion apparatus 1.

In the present embodiment, the frame 3 has the two facing pairs of the side walls 32, i.e., the pair of front and rear walls 321 and 322 and the pair of left and right walls 323. All the side walls 32 of the frame 3 together enclose the semiconductor modules 11.

With the above configuration, it is possible to further improve the rigidity of the frame 3, thereby further improving the vibration resistance of the frame 3.

In the present embodiment, the semiconductor modules 11 are alternately stacked with the cooling pipes 121 to form the stacked body 10, so that for each of the semiconductor modules 11, both the major surfaces of the semiconductor module 11 can be cooled by the coolant flowing through the cooling pipes 121. Further, the stacked body 10 is received in the frame 3.

With the above configuration, misalignment between the semiconductor modules 11 and the cooling pipes 121 may occur if the frame 3 vibrates. However, in the present embodiment, the vibration resistance of the frame 3 is improved as described above. Consequently, it is possible to prevent misalignment between the semiconductor modules 11 and the cooling pipes 121 from occurring in the stacked body 10. As a result, it is possible to securely hold the stacked body 10 in the frame 3.

In the present embodiment, the frame 3 also has the bottom wall 31 that extends, on the opposite side of the stacked body 10 to the reinforcing and fixing member 2, to connect the side walls 32 of the frame 3.

Consequently, with the bottom wall 31, the rigidity of the frame 3 is further improved, thereby further improving the vibration resistance of the frame 3.

In the present embodiment, the front and rear walls 321 and 322 of the frame 3 are respectively positioned on opposite sides of the stacked body 10 in the stacking direction of the stacked body 10 (i.e., in the X direction). The pressing member 5 is interposed between the stacked body 10 and the rear wall 322 of the frame 3 to press and thereby hold the stacked body 10.

With the above configuration, the pressing member 5 also exerts a pressing force on the rear wall 322 of the frame 3. Therefore, if the rigidity of the frame 3 was insufficient, the frame 3 would be deformed by the pressing force of the pressing member 5. However, in the present embodiment, the rigidity of the frame 3 is improved as described above. Consequently, the frame 3 is prevented from being deformed by the pressing force of the pressing member 5.

[Second Embodiment]

This embodiment illustrates an electric power conversion apparatus 1 which has almost the same configuration as the electric power conversion apparatus 1 according to the first embodiment; accordingly, only the differences therebetween will be described hereinafter.

In the first embodiment, the stacked body 10 is interposed in the Z direction between the reinforcing and fixing member 2 and the bottom wall 31 of the frame 3, with a gap formed between the reinforcing and fixing member 2 and the stacked body 10 (see FIGS. 1 and 2).

Figure 4:
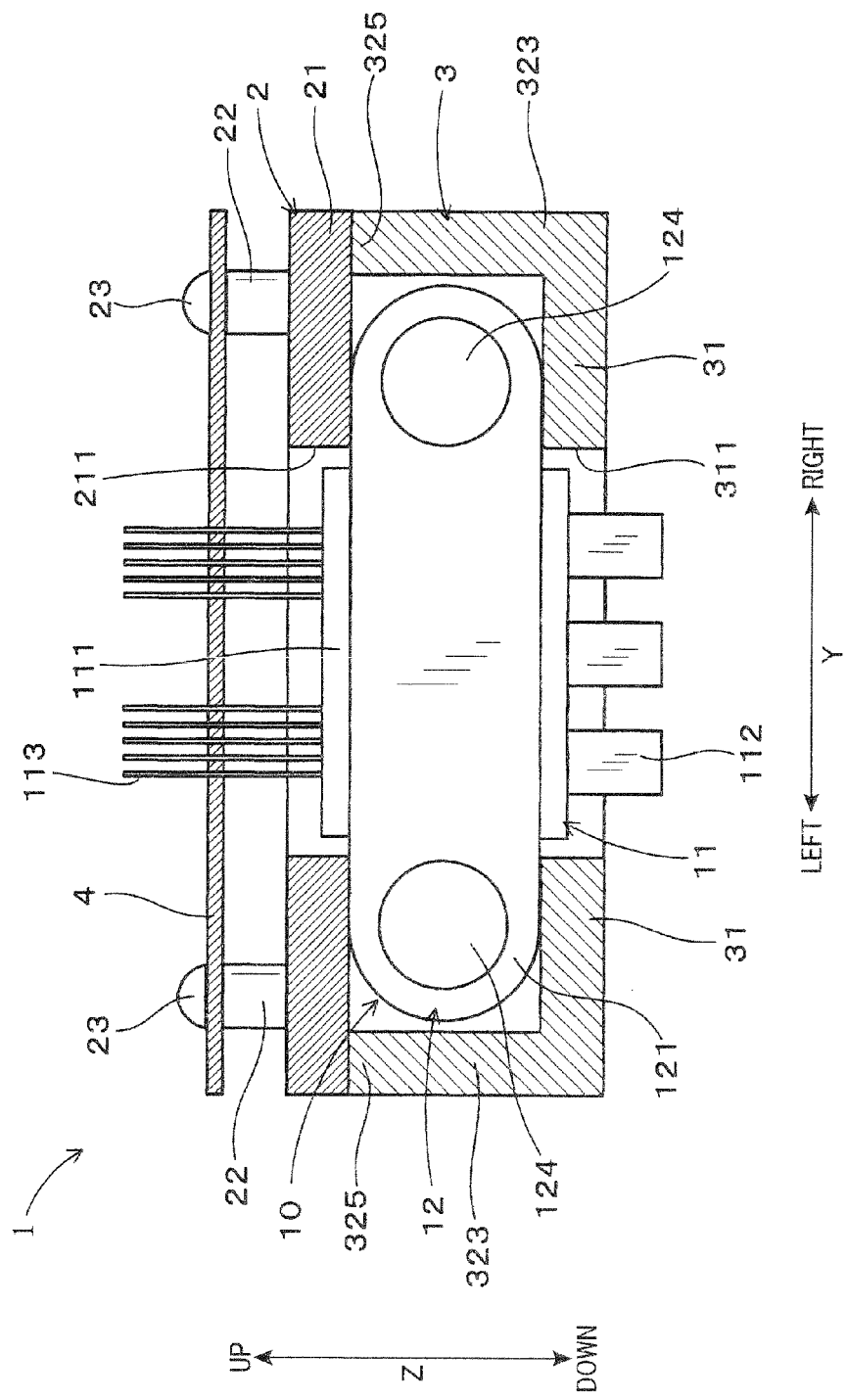
FIG. 4 is a cross-sectional view illustrating the overall configuration of an electric power conversion apparatus according to a second embodiment.

In comparison, in the present embodiment, as shown in FIG. 4, the stacked body 10 is sandwiched in the Z direction between the reinforcing and fixing member 2 and the bottom wall 31 of the frame 3, without a gap formed between the reinforcing and fixing member 2 and the stacked body 10.

More specifically, in the present embodiment, the height of the side walls 32 of the frame 3 is so set that the upper ends of the side walls 32 are flush with the upper end surfaces of the cooling pipes 121. Further, the width of the through-hole 211 of the reinforcing and fixing member 2 in the Y direction is increased, thereby allowing upper end portions of the semiconductor modules 11, which protrude upward from the upper end surfaces of the cooling pipes 121, to be inserted in the though-hole 211. Consequently, it becomes possible for the reinforcing and fixing member 2 to abut the upper end surfaces of the cooling pipes 121, thereby sandwiching, together with the bottom wall 31 of the frame 3, the cooling pipes 121 in the Z direction. In addition, the cooling pipes 121 are sandwiched between the reinforcing and fixing member 2 and the bottom wall 31 of the frame 3 on both opposite sides of the semiconductor modules 11 in the Y direction.

The above-described electric power conversion apparatus 1 according to the present embodiment has the same advantages as the electric power conversion apparatus 1 according to the first embodiment.

In addition, in the present embodiment, with the stacked body 10 sandwiched between the reinforcing and fixing member 2 and the bottom wall 31 of the frame 3, it is possible to prevent relative movement between the stacked body 10 and the frame 3, thereby minimizing load imposed on the stacked body 10 due to vibration of the frame 3.

[Third Embodiment]

This embodiment illustrates an electric power conversion apparatus 1 which has almost the same configuration as the electric power conversion apparatus 1 according to the first embodiment; accordingly, only the differences therebetween will be described hereinafter.

In the first embodiment, in the main body 21 of the reinforcing and fixing member 2, there is formed only the single through-hole 211 through which all the control terminals 113 of the semiconductor modules 11 extend so as to be connected to the control circuit board 4 (see FIGS. 1-3).

Figure 5:
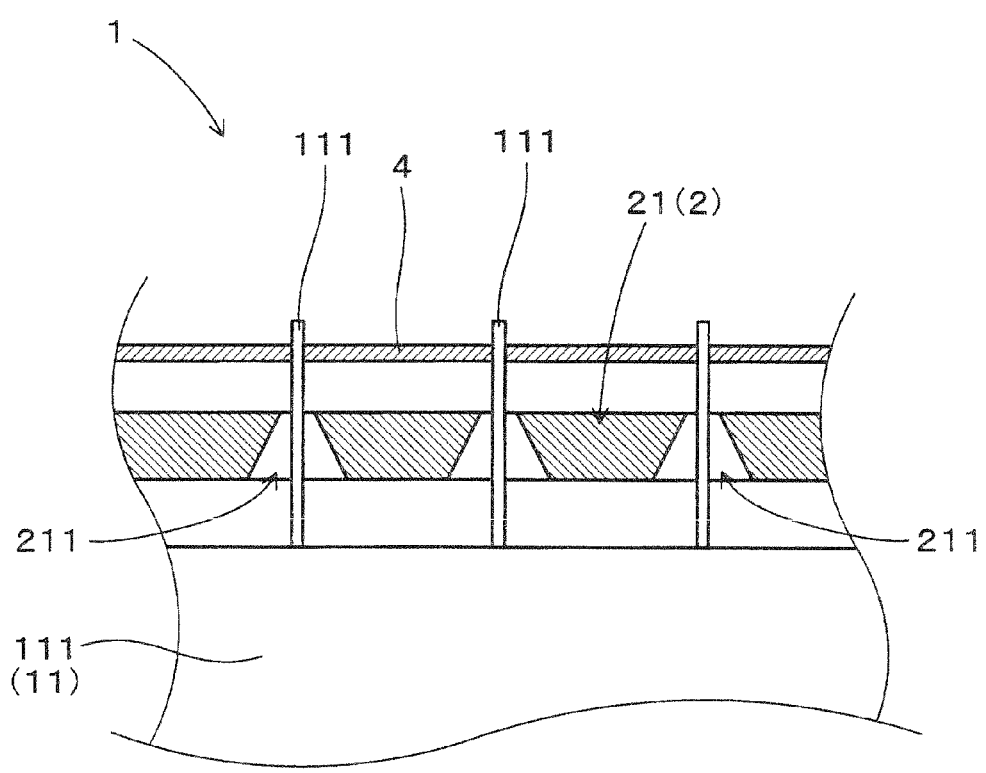
FIG. 5 is a cross-sectional view of part of an electric power conversion apparatus according to a third embodiment.

In comparison, in the present embodiment, as shown in FIG. 5, in the main body 21 of the reinforcing and fixing member 2, there are formed a plurality of through-holes 211 through each of which a corresponding one of the control terminals 113 of the semiconductor modules 11 extends so as to be connected to the control circuit board 4.

Moreover, in the present embodiment, each of the through-holes 211 has a cross section that tapers upward (i.e., toward the control circuit board 4), thereby allowing the corresponding control terminal 113 to be positioned with respect to the control circuit board 4 by the through-hole 211.

The above-described electric power conversion apparatus 1 according to the present embodiment has the same advantages as the electric power conversion apparatus 1 according to the first embodiment.

In addition, in the present embodiment, with the through-holes 211 formed in the main body 21 of the reinforcing and fixing member 2, it is possible to easily position the corresponding control terminals 113 of the semiconductor modules 11 with respect to the reinforcing and fixing member 2, thus easily positioning the corresponding control terminals 113 with respect to the control circuit board 4 that is fixed to the reinforcing and fixing member 2. Moreover, since the through-holes 211 are wider on the semiconductor modules 11-side surface (i.e., the lower surface) of the main body 21 of the reinforcing and fixing member 2 than on the control circuit board 4-side surface (i.e., the upper surface) of the main body 21, it is possible to easily insert the control terminals 113 of the semiconductor modules 11 respectively into the corresponding through-holes 211.

It should be noted that when the size of the through-holes 211 is small, it is preferable to perform an insulation treatment between the inner walls of the through-holes 211 and the corresponding control terminals 113. For example, it is possible to provide insulation layers on the inner walls of the through-holes 211 or to provide the through-holes 211 with insulative resin-made collars. Alternatively, it is also possible to make the entire reinforcing and fixing member 2 with an insulative resin.

[Fourth Embodiment]

This embodiment illustrates an electric power conversion apparatus 1 which has almost the same configuration as the electric power conversion apparatus 1 according to the first embodiment; accordingly, only the differences therebetween will be described hereinafter.

In the first embodiment, the bottom wall 31 of the frame 3 is integrally formed with the side walls 32 of the frame 3 into one piece (see FIGS. 1 and 2).

Figure 6:
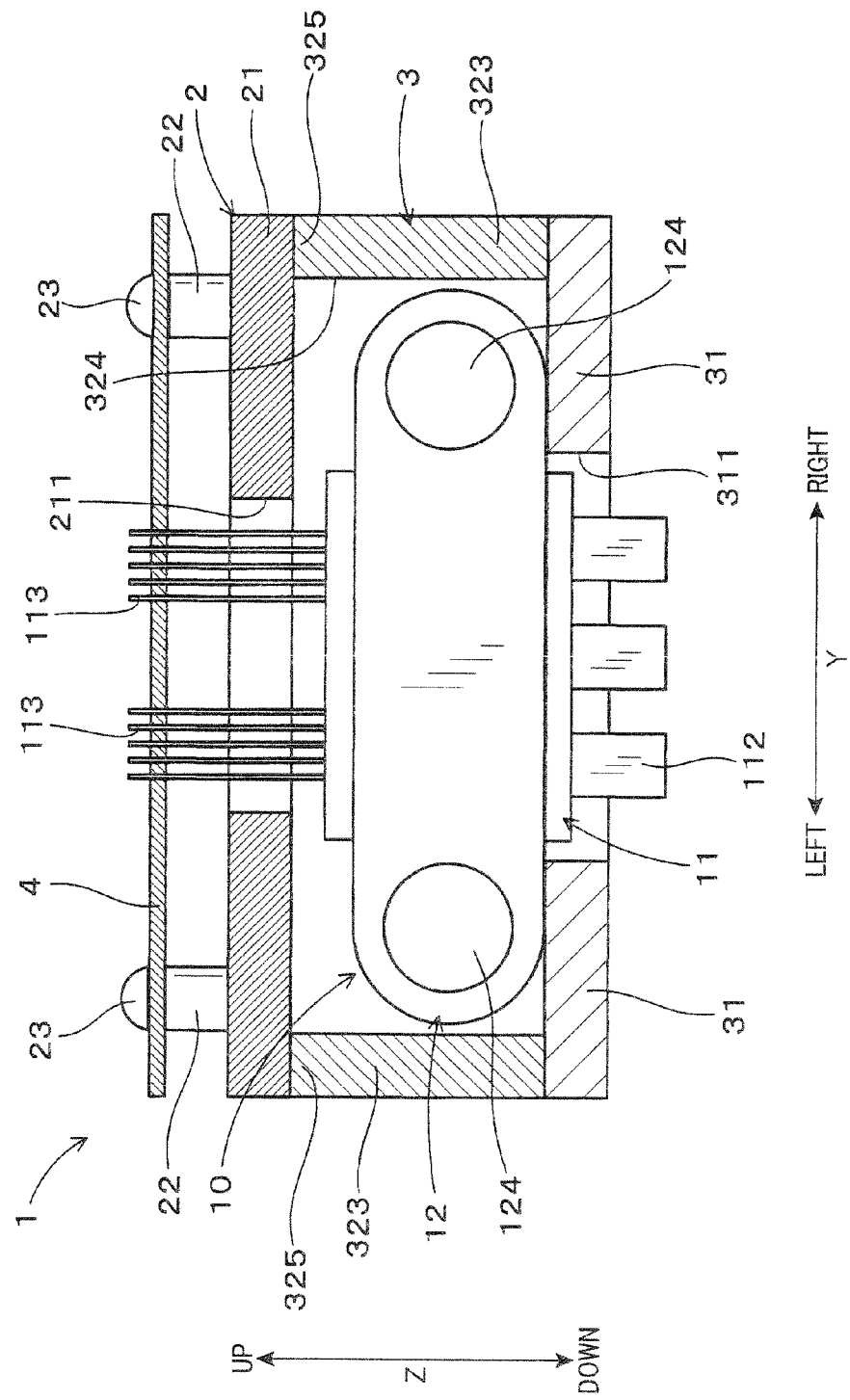
FIG. 6 is a cross-sectional view illustrating the overall configuration of an electric power conversion apparatus according to a fourth embodiment.

In comparison, in the present embodiment, as shown in FIG. 6, the bottom all 31 is separately formed from the side walls 32 and joined to the side walls 32. More specifically, the bottom wall 31 is provided in the form of a substantially rectangular plate and fixed to the lower ends of the side walls 32 by means of bolts (not shown).

The above-described electric power conversion apparatus 1 according to the present embodiment has the same advantages as the electric power conversion apparatus 1 according to the first embodiment.

In addition, in the present embodiment, by forming the bottom wall 31 separately from the side walls 32, it is possible to simplify the shapes of the bottom and side walls 31 and 32, thereby improving the productivity. Moreover, it is also possible to utilize an existing part of the electric power conversion apparatus 1 to make up the bottom wall 31, thereby preventing an increase in the parts count of the electric power conversion apparatus 1. The existing part may be, for example, a bus bar assembly that includes the bus bars to which the electrode terminals 112 of the semiconductor modules 11 are connected.

[Fifth Embodiment]

This embodiment illustrates an electric power conversion apparatus 1 which has almost the same configuration as the electric power conversion apparatus 1 according to the first embodiment; accordingly, only the differences therebetween will be described hereinafter.

In the first embodiment, the frame 3 includes both the bottom wall 31 and the side walls 32 (see FIGS. 1 and 2).

Figure 7:
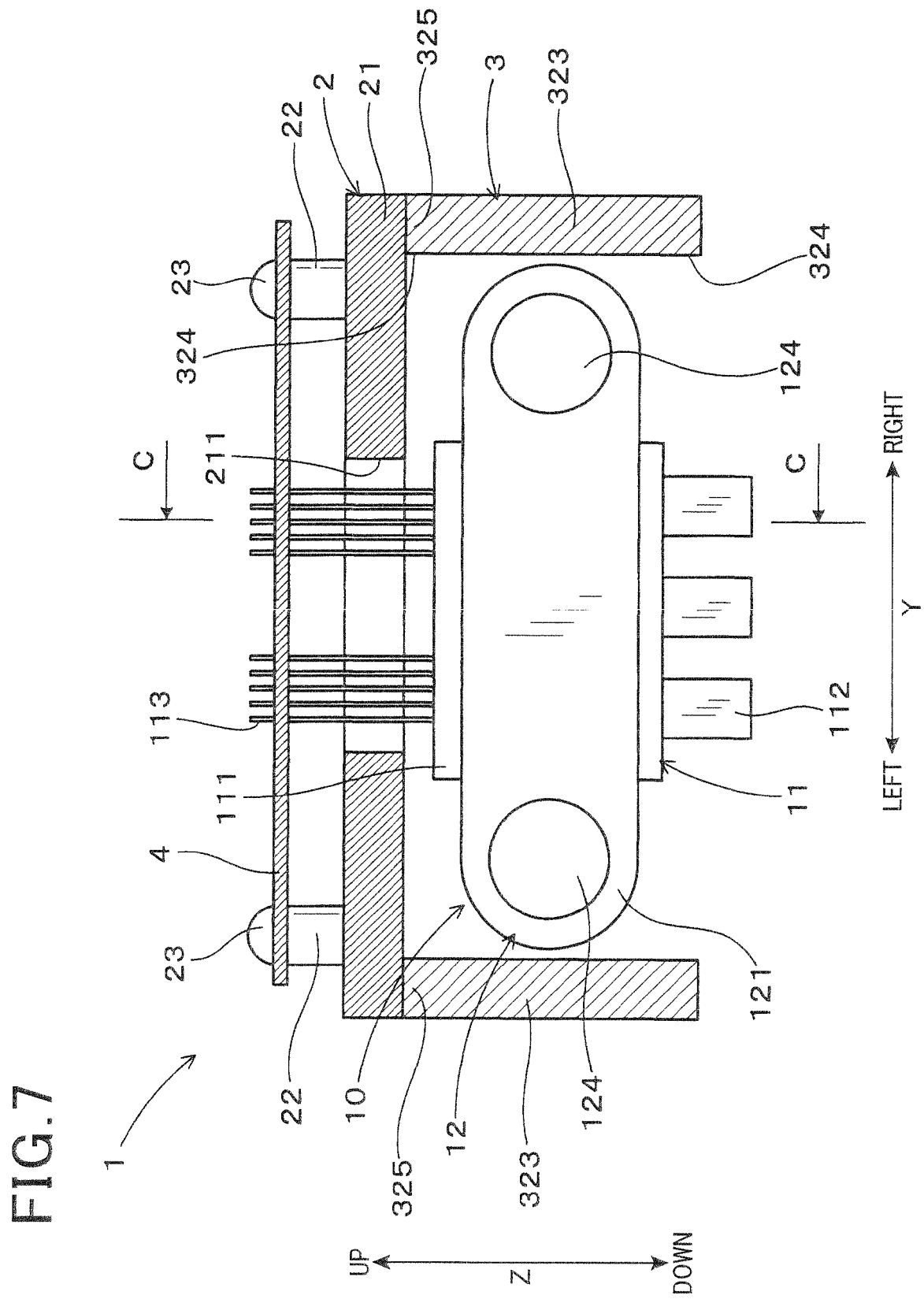
FIG. 7 is a cross-sectional view illustrating the overall configuration of an electric power conversion apparatus according to a fifth embodiment.
Figure 8:
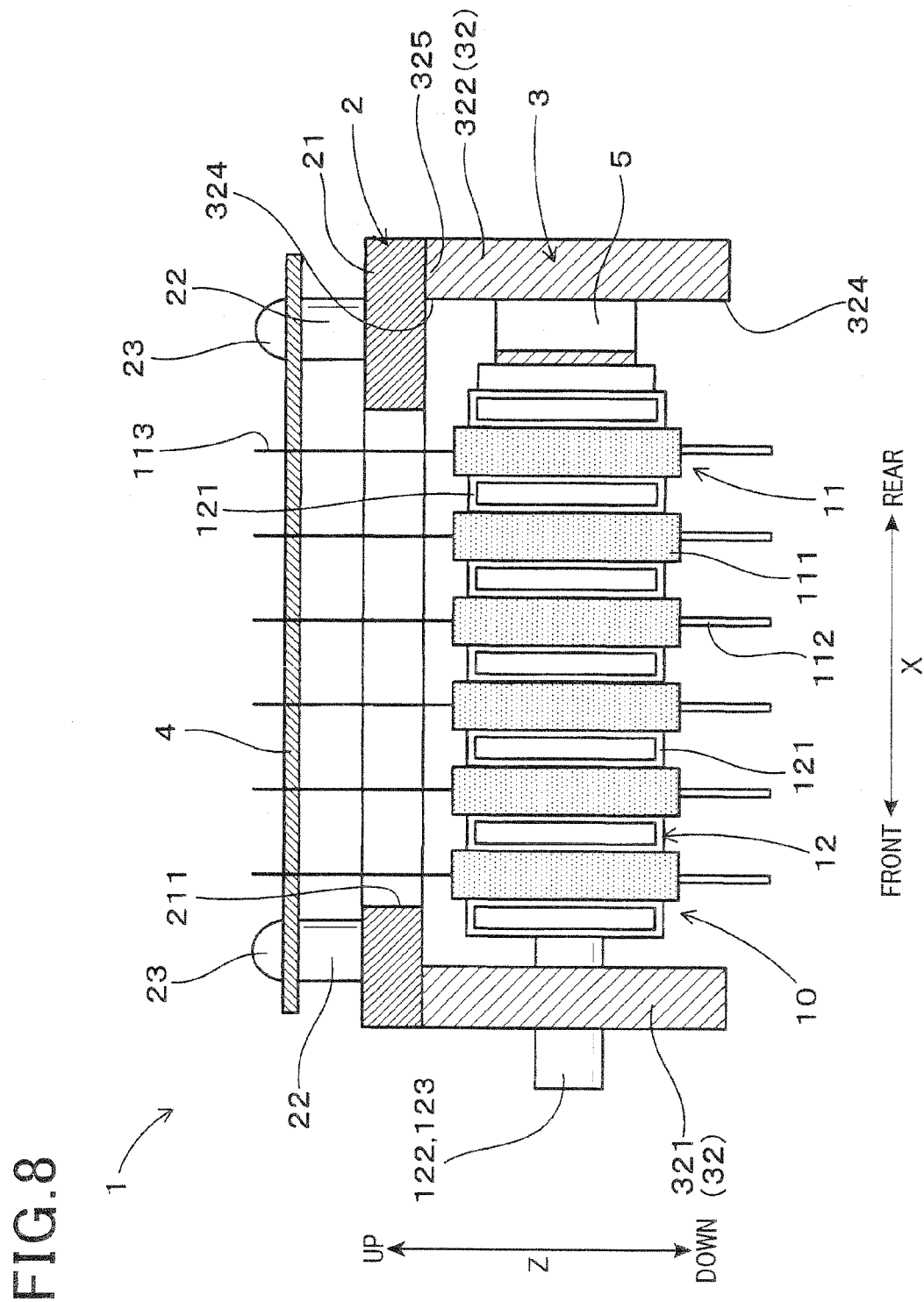
FIG. 8 is a cross-sectional view of the electric power conversion apparatus according to the fifth embodiment taken along the line C-C in FIG. 7.
Figure 9:
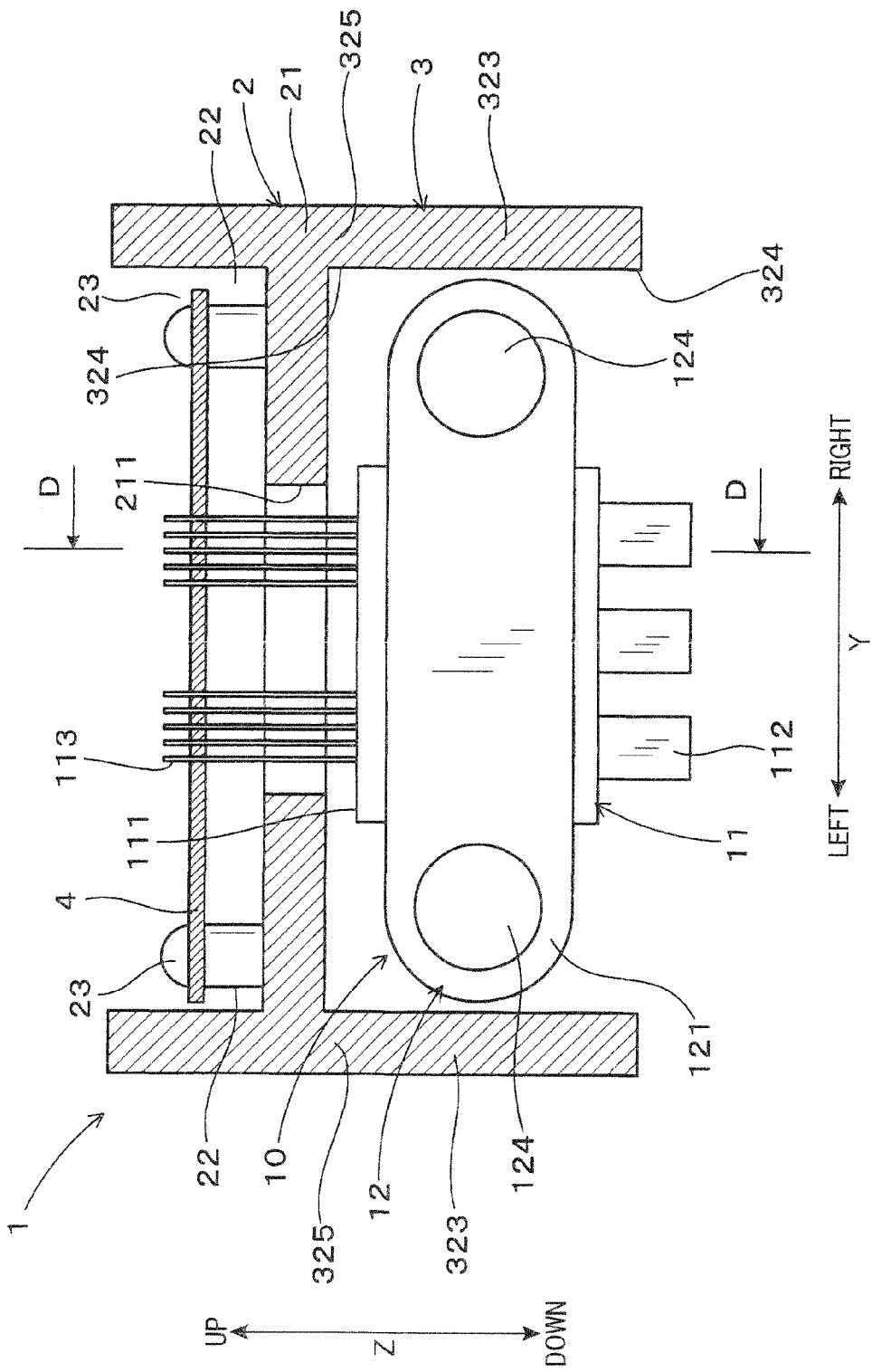
FIG. 9 is a cross-sectional view illustrating the overall configuration of an electric power conversion apparatus according to a sixth embodiment.
Figure 10:
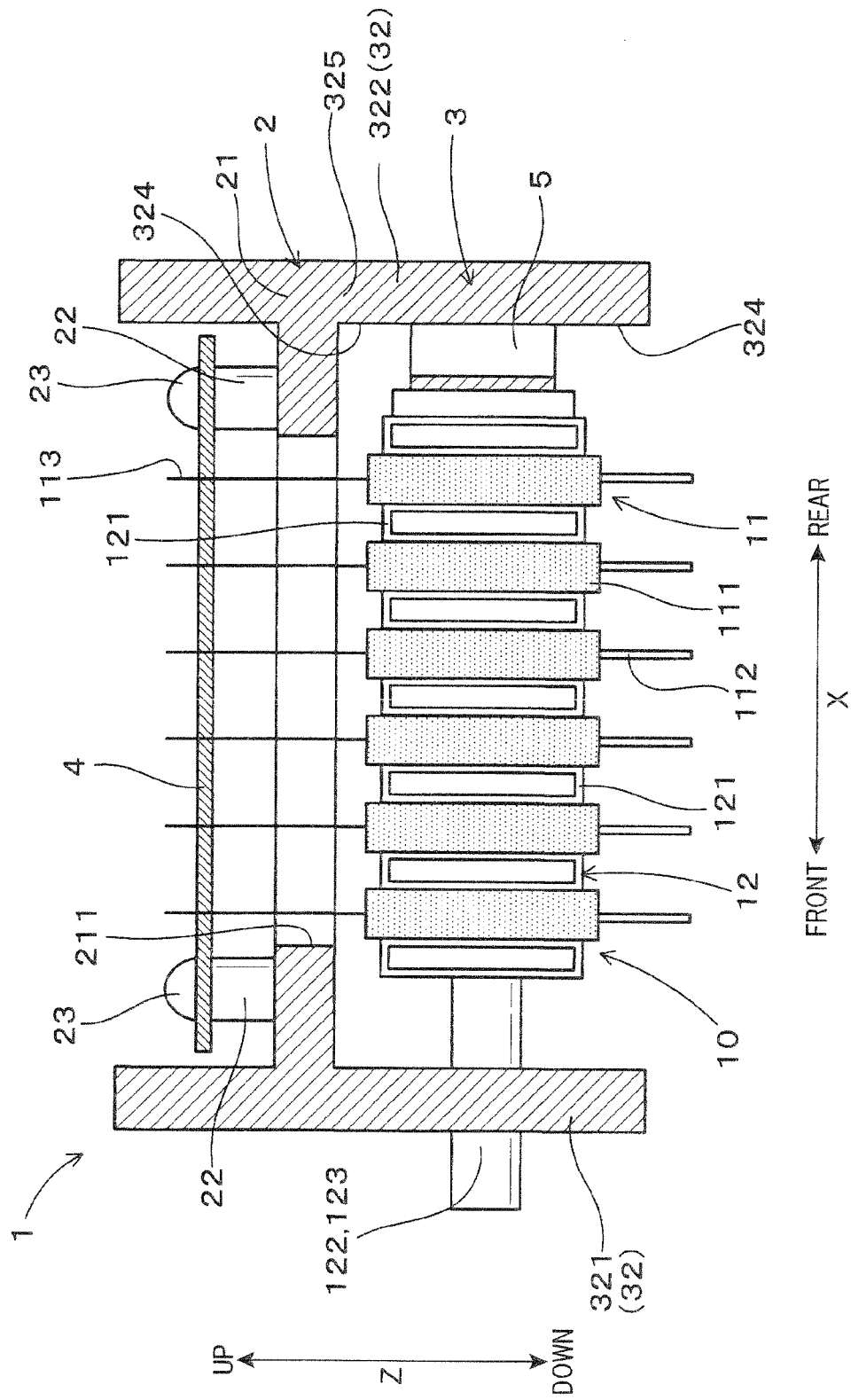
FIG. 10 is a cross-sectional view of the electric power conversion apparatus according to the sixth embodiment taken along the line D-D in FIG. 9.
Figure 11:
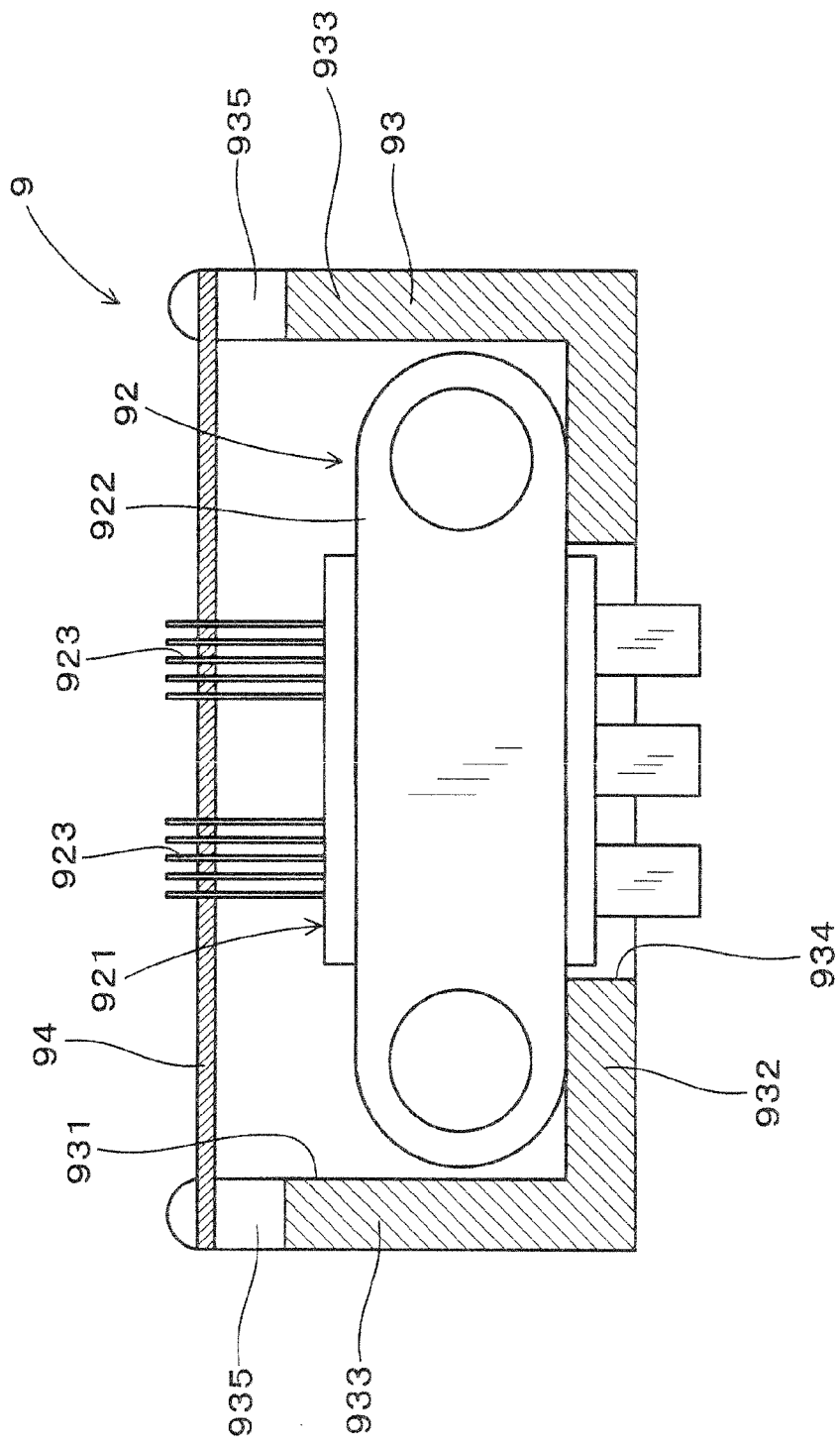
FIG. 11 is a cross-sectional view illustrating the overall configuration of an electric power conversion apparatus according to the related art.

In comparison, in the present embodiment, as shown in FIGS. 7 and 8, the bottom wall 31 is omitted from the frame 3 so that the frame 3 includes only the side walls 32. Consequently, in addition to the opening 324 that is formed at the upper end of the frame 3 and covered by the reinforcing and fixing member 2, the frame 3 also has an opening 324 that is formed at the lower end of the frame 3 and kept open.

The above-described electric power conversion apparatus 1 according to the present embodiment has approximately the same advantages as the electric power conversion apparatus 1 according to the first embodiment.

[Sixth Embodiment]

This embodiment illustrates an electric power conversion apparatus 1 which has almost the same configuration as the electric power conversion apparatus 1 according to the first embodiment; accordingly, only the differences therebetween will be described hereinafter.

In the first embodiment, the frame 3 includes both the bottom wall 31 and the side walls 32. Moreover, the reinforcing and fixing member 2 is separately formed from the frame 3 and fixed to the side walls 32 of the frame 3 (see FIGS. 1 and 2).

In comparison, in the present embodiment, as shown in FIGS. 7 and 8, the bottom wall 31 is omitted from the frame 3. Moreover, the reinforcing and fixing member 2 is integrally formed with the frame 3 into one piece.

More specifically, in the integrated body of the reinforcing and fixing member 2 and the frame 3, the side walls 32 of the frame 3 each extend from an outer periphery of the main body 21 of the reinforcing and fixing member 2 both upward and downward. Consequently, the integrated body has a cross section that is perpendicular to the X direction and substantially H-shaped (see FIG. 9); the integrated body also has a cross section that is perpendicular to the Y direction and substantially H-shaped (see FIG. 10). Moreover, the internal space enclosed by the side walls 32 is partitioned by the reinforcing and fixing member 2 into lower and upper parts. In the lower part, there is received the stacked body 10 of the semiconductor modules 11 and the cooling pipes 121. On the other hand, in the upper part, there is received the control circuit board 4.

The above-described electric power conversion apparatus 1 according to the present embodiment has approximately the same advantages as the electric power conversion apparatus 1 according to the first embodiment.

In addition, in the present embodiment, by forming the reinforcing and fixing member 2 integrally with the frame 3, it is possible to reduce the parts count of the electric power conversion apparatus 1 and facilitates the assembly process of the electric power conversion apparatus 1. Moreover, by configuring the side walls 32 to extend from the reinforcing and fixing member 2 both upward and downward, it is possible to further improve the rigidity of the frame 3, thereby further improving the vibration resistance of the frame 3.

While the above particular embodiments have been shown and described, it will be understood by those skilled in the art that various modifications, changes, and improvements may be made without departing from the spirit of the invention.

For example, in the previous embodiments, the coolant passages are formed in the cooling pipes 121, and the cooling pipes 121 are alternately stacked with the semiconductor modules 11. Consequently, the semiconductor modules 11 can be cooled by the coolant flowing through the coolant passages without being directly exposed to the coolant.

However, the coolant passages may also be formed of air gaps between the semiconductor modules 11 so that the semiconductor modules 11 can be directly exposed to and thus cooled by the coolant flowing through the coolant passages.

In the previous embodiments, the semiconductor modules 11 are alternately stacked with the cooling pipes 121 to form the stacked body 10, and the stacked body 10 is received in the frame 3.

However, it is also possible to first form a plurality of power modules, each of which has a predetermined number of the semiconductor modules integrated thereinto or both a predetermined number of the semiconductor modules and a predetermined number of the cooling passages integrated thereinto, and then arrange the power modules in the frame 3.

In the previous embodiments, the pressing member 5 is disposed on the rear side of the stacked body 10 as shown in FIGS. 2 and 3.

However, the pressing member 5 may also be disposed on the front side of the stacked body 10. More specifically, in this case, the pressing member 5 may be interposed between the front wall 321 of the frame 3 and the stacked body 10 in the X direction and between the inlet pipe 122 and the outlet pipe 123 in the Y direction.

In the previous embodiments, both the inlet pipe 122 and the outlet pipe 123 are arranged to protrude forward from the cooling pipe 121 located at the front end of the stacked body 10.

However, it is also possible to arrange only one of the inlet pipe 122 and the outlet pipe 123 to protrude forward from the cooling pipe 121 located at the front end of the stacked body 10 and the other to protrude backward from the cooling pipe 121 located at the rear end of the stacked body 10.

What is claimed is:

1. An electric power conversion apparatus comprising:
    a plurality of semiconductor modules each of which has a plurality of control terminals;
    a frame that receives the semiconductor modules therein, the frame having, at least, a pair of side walls that face each other with the semiconductor modules interposed therebetween;
    a control circuit board which is located outside of the frame and to which the control terminals of the semiconductor modules are connected;
    a reinforcing and fixing member that extends to connect the side walls of the frame, thereby reinforcing the frame, the reinforcing and fixing member also having the control circuit board fixed thereto so that the reinforcing and fixing member is positioned between the control circuit board and the semiconductor modules; and
    a cooling device arranged in the frame to cool the semiconductor modules, and
    wherein
    in the reinforcing and fixing member, there is formed at least one through-hole through which the control terminals of the semiconductor modules extend so as to be connected to the control circuit board, and
    the at least one through-hole of the reinforcing and fixing member is sized so that void spaces are formed between an inner surface of the at least one through-hole and the control terminals of the semiconductor modules.

2. The electric power conversion apparatus as set forth in claim 1, wherein the frame has a plurality of facing pairs of side walls, and all the side walls of the frame together enclose the semiconductor modules.

3. The electric power conversion apparatus as set forth in claim 1, wherein the reinforcing and fixing member is integrally formed with the side walls of the frame into one piece.

4. The electric power conversion apparatus as set forth in claim 1, wherein the semiconductor modules are stacked with a plurality of coolant passages of the cooling device to form a stacked body, and the stacked body is received in the frame.

5. The electric power conversion apparatus as set forth in claim 4, wherein the semiconductor modules are alternately stacked with the coolant passages.

6. The electric power conversion apparatus as set forth in claim 4, wherein the frame also has a bottom wall that extends, on the opposite side of the stacked body to the reinforcing and fixing member, to connect the side walls of the frame.

7. The electric power conversion apparatus as set forth in claim 6, wherein the stacked body is sandwiched between the reinforcing and fixing member and the bottom wall of the frame.

8. The electric power conversion apparatus as set forth in claim 4, wherein the side walls of the frame are respectively positioned on opposite sides of the stacked body in a stacking direction of the stacked body, and
    a pressing member is interposed between the stacked body and one of the side walls of the frame in the stacking direction to press and thereby hold the stacked body.

9. The electric power conversion apparatus as set forth in claim 1, the at least one through-hole of the reinforcing and fixing member comprises a plurality of through-holes through each of which a corresponding one of the control terminals of the semiconductor modules extends so as to be connected to the control circuit board, and
    each of the through-holes has a cross section that tapers toward the control circuit board, thereby allowing the corresponding control terminal to be positioned, by the through-hole, with respect to the control circuit board.

10. The electric power conversion apparatus as set forth in claim 1, wherein the semiconductor modules are aligned with each other in an X direction, the at least one through-hole of the reinforcing and fixing member has a smaller width than the semiconductor modules in a Y direction, and the reinforcing and fixing member is made of an electrically conductive material.

* * * * *